(12) United States Patent
Stecher et al.

(10) Patent No.: US 11,754,640 B2
(45) Date of Patent: Sep. 12, 2023

(54) DEVICE COMPRISING TWO VOLTAGE DOMAINS AND METHOD

(71) Applicant: Infineon Technologies AG, Neubiberg (DE)

(72) Inventors: Matthias Stecher, Munich (DE); Hermann Gruber, Woerth a. d Isar (DE); Thorsten Hinderer, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 149 days.

(21) Appl. No.: 17/219,059

(22) Filed: Mar. 31, 2021

(65) Prior Publication Data

US 2021/0318392 A1 Oct. 14, 2021

(30) Foreign Application Priority Data

Apr. 9, 2020 (DE) .......................... 102020110001.9

(51) Int. Cl.
*G01R 31/62* (2020.01)
*H01F 27/40* (2006.01)
*H01F 27/29* (2006.01)

(52) U.S. Cl.
CPC .............. *G01R 31/62* (2020.01); *H01F 27/29* (2013.01); *H01F 27/40* (2013.01)

(58) Field of Classification Search
CPC ......... G01R 31/62; H01F 27/29; H01F 27/40; H01F 2019/085; H01F 2027/2819; H01F 27/2804; H01F 27/402; H01L 29/0603; H01L 23/645; H01L 27/0203; H01L 27/0207; H01L 29/0684
See application file for complete search history.

(56) References Cited

U.S. PATENT DOCUMENTS

| 9,048,150 B1* | 6/2015 | Roehner ................. H01L 24/96 |
| 2005/0074908 A1* | 4/2005 | Ciplickas ............... H01L 22/34 438/15 |
| 2010/0134125 A1 | 6/2010 | Aubel et al. |
| 2011/0248357 A1* | 10/2011 | Kwon ............. H01L 21/823462 257/E27.06 |
| 2013/0075861 A1* | 3/2013 | Kerber .................... H01L 24/05 257/532 |
| 2013/0313654 A1 | 11/2013 | Kwon et al. |
| 2015/0299852 A1* | 10/2015 | Ozkan .................... H01G 4/008 361/305 |
| 2017/0287624 A1 | 10/2017 | Osada et al. |
| 2018/0247596 A1* | 8/2018 | Zhao .................... G09G 3/3208 |

* cited by examiner

*Primary Examiner* — Robert H Kim
*Assistant Examiner* — Christopher J Gassen
(74) *Attorney, Agent, or Firm* — Slater Matsil, LLP (57) ABSTRACT

A device including a first voltage domain and a second voltage domain is provided, the voltage domains being separated by an isolation barrier. In addition, the device includes a scratch detection circuit including a first and a second electrode at a distance of less than 2 μm.

18 Claims, 6 Drawing Sheets

DEVICE COMPRISING TWO VOLTAGE DOMAINS AND METHOD

This application claims the benefit of German Application No. 102020110001.9, filed on Apr. 9, 2020, which application is hereby incorporated herein by reference.

TECHNICAL FIELD

The present application relates to devices comprising two voltage domains galvanically isolated by an isolation barrier, and methods therefor. In particular, the application relates to devices and methods enabling a test which can increase a fail-safety of the device.

BACKGROUND

In various applications, for example automotive applications, signals have to be transmitted between various voltage domains. By way of example, signals have to be transmitted between a circuit part which operates with high voltage (for example in the range of greater than 20 V or greater than 100 V, e.g. 400 V), such as an inverter of an electric motor, and a circuit part which operates with low voltages (for example 5 V or 12 V), such as e.g. a control circuit such as for the inverter. In this case, the voltage values and circuit parts mentioned above should be understood merely as examples.

In this case, transformers constitute one possibility for signal transmission between the voltage domains. One specific type of such transformers is so-called coreless transformers, in which coils of the transformer are arranged in different metal layers on a substrate, in particular semiconductor substrate, with a dielectric therebetween. In this case, the coils are usually surrounded by a guard ring connected to ground.

Such a transformer can be used to provide signal transmission while at the same time providing an isolation barrier, which prevents the flow of currents, in particular direct currents, between the voltage domains and thus constitutes a galvanic isolation. In other implementations, instead of using transformers, it is possible to use capacitive signal transmission by way of capacitors, wherein for example capacitor plates of such capacitors can likewise be provided in different metal layers and can be separated by a dielectric.

In many applications here it is important or even safety-critical for said isolation barrier to be intact. By way of example, it may be important to prevent the high voltage from one voltage domain from passing into another voltage domain having low voltage.

In some implementations, copper is used as metal for coils of such transformers or else capacitors; copper has a low resistivity and may thus result in lower electrical losses compared with other metals. In the course of the processing of copper metal layers, chemical mechanical polishing is used in many implementations. During this chemical mechanical polishing, scratches can occur as a result of particles in a polishing medium used, e.g. polishing solution or polishing paste, referred to as a slurry. Said particles may in particular be pressed into comparatively soft metal structures (for example copper lines), and then reach the dielectric used, for example silicon dioxide, and damage the latter. This may result in a high-voltage breakdown.

In order to avoid such a high-voltage breakdown in finished products, firstly an optical inspection is used to find scratches optically. However, it can happen here that scratches are not recognized. In addition, the devices are usually tested with corresponding high voltages. However, some instances of damage to the dielectric caused by scratches may be such that this test is passed, but the risk of a high-voltage breakdown during later operation is nevertheless increased since every test method entails a degree of uncertainty.

SUMMARY

In accordance with one exemplary embodiment, a device is provided, comprising:
a first voltage domain designed to be operated at a first voltage,
a second voltage domain designed to be operated at a second voltage,
an isolation barrier separating the first and second voltage domains, and
a scratch detection circuit comprising a first electrode and a second electrode, wherein a distance between the first electrode and the second electrode is less than 2 µm.

In accordance with a further exemplary embodiment, a method for testing such a device is provided, comprising:
applying a voltage between the first electrode and the second electrode,
determining whether a scratch is present on the basis of a current between the electrode and the second electrode in reaction to the voltage.

The brief summary above merely offers a short overview of some exemplary embodiments and should not be interpreted as restrictive, since other exemplary embodiments can have features other than those discussed above.

DETAILED DESCRIPTION OF ILLUSTRATIVE EMBODIMENTS

Various exemplary embodiments are explained in detail below. They serve merely as examples and should not be interpreted as restrictive. By way of example, in other exemplary embodiments, some of the features, components or method steps presented can be omitted or replaced by alternative features, components or method steps. Besides the features, components and method steps presented, further features, components or method steps can also be provided, in particular features and components used in conventional devices comprising two voltage domains and an isolation barrier, which are therefore not explicitly described.

Features of different exemplary embodiments can be combined with one another, unless indicated otherwise. Variations, modifications and details described for one of the exemplary embodiments are also applicable to other exemplary embodiments and are therefore not explained repeatedly.

Figure 1:
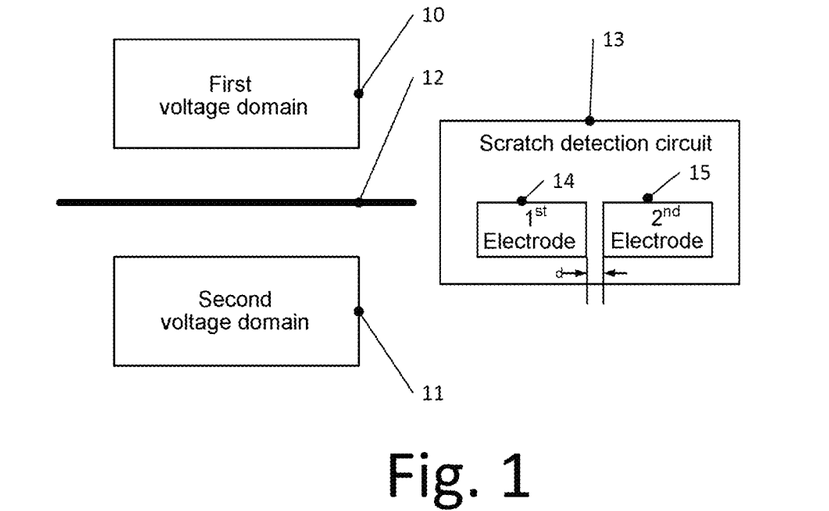
FIG. 1 is a block diagram of a device in accordance with one exemplary embodiment.

FIG. 1 is a block diagram of a device in accordance with one exemplary embodiment. The device in FIG. 1 can be a semiconductor component or a semiconductor device embodied on a semiconductor substrate.

The device in FIG. 1 comprises a first voltage domain 10 and a second voltage domain 11. In this case, the first voltage domain 10 and the second voltage domain 11 can be integrated on a single chip. In this case, within the meaning of the present application, a voltage domain is a region of a device which is designed for a specific maximum voltage and/or is supplied by a specific supply voltage. The first voltage domain 10 and the second voltage domain 11 are galvanically isolated by an isolation barrier 12. For signal transmission across the isolation barrier 12, various facilities can be used, for example a transformer, by which signals can be transmitted inductively, or a capacitor, which enables signals to be transmitted capacitively. In some exemplary embodiments, a coreless transformer can be used, as will be explained by way of example further below with reference to FIG. 2.

The first voltage domain 10 can operate at a high voltage, and the second voltage domain 11 can operate at a low voltage, wherein the terms "high voltage" and "low voltage" should be understood here to be relative, i.e. the high voltage is higher than the low voltage. By way of example, the first voltage domain 10 can operate at voltages of greater than 20 V or greater than 100 V, e.g. 400 V, and the second voltage domain 11 can operate at voltages of less than 10 V. A voltage difference between the first voltage domain 10 and the second voltage domain 11 can be greater than 20 V, e.g. greater than 50 V or greater than 100 V. However, these voltages should be understood merely as examples. Moreover, in other exemplary embodiments, the first voltage domain 10 and the second voltage domain 11 can operate at similar or identical voltages and nevertheless be separated by the isolation barrier 12. In still other exemplary embodiments, the first voltage domain 10 can operate at a lower voltage than the second voltage domain 11.

In some exemplary embodiments, the second voltage domain 11 can comprise a control circuit for controlling power transistors, and the first voltage domain 10 can comprise an interface to such power transistors of, for example, a multiphase inverter for driving an electric motor. Said power transistors can be arranged separately from the device in FIG. 1 on a further chip, for example, and the first voltage domain 10 of the device in FIG. 1 can comprise for example high-voltage-side transformer coils and corresponding terminals of a transformer for signal transmission across the isolation barrier 12 or a high-voltage-side capacitor plate and corresponding terminals of a capacitor for such signal transmission.

Coils of such a transformer or plates of such a capacitor can comprise copper conductive tracks or copper plates in one or more metal layers which are deposited and structured on a semiconductor substrate. Chemical mechanical polishing (CMP) can be used in the fabrication of such copper metal layers. Scratches can occur during such CMP processes, and can impair the functionality of the isolation barrier 12, as explained in the introduction.

In order to detect such scratches, the device in FIG. 1 has a scratch detection circuit 13. The scratch detection circuit 13 comprises a first electrode 14 and a second electrode 15, which are arranged at a distance d from one another. The distance d can be less than 2 µm, for example less than 1 µm, for example in the range of 600 nm or less. In some implementations, d corresponds to a minimum distance that can be realized in a fabrication technology used. An insulation material, for example an oxide or other dielectric, is arranged between the first electrode 14 and the second electrode 15.

The first electrode 14 and the second electrode 15 can be arranged in a metal layer in which a coil of the abovementioned transformer or a plate of the abovementioned capacitor is arranged. The first electrode 14 and the second electrode 15 can each comprise a plurality of partial electrodes, wherein each of the partial electrodes is arranged in such a metal layer of a coil or a capacitor plate. Examples thereof will also be explained later. The first electrode 14 can be formed by a guard ring surrounding the first voltage domain 10 or a part thereof, for example surrounding a transformer or capacitor for signal transmission across the isolation barrier 12. In other exemplary embodiments, the first electrode 14 can also be provided in addition to such a guard ring. In respect of this, too, examples will also be explained. The first electrode 14 and the second electrode 15 can wholly or partly surround the first voltage domain 10, and/or be embodied over one or more regions of the device in FIG. 1. In some exemplary embodiments, the probability of detecting critical scratches can be increased in this way.

For scratch detection, after the device in FIG. 1 has been produced, a voltage is applied between the first electrode 14 and the second electrode 15. For this purpose, for example, the first electrode 14 can be fixedly connected to ground, and a voltage can be applied to the second electrode 15 by way of a test pad. In other exemplary embodiments, a voltage can also be applied to both electrodes 14, 15 by way of a corresponding respective test pad. Said voltage can for example be lower than a voltage difference between the first voltage domain 10 and the second voltage domain 11 during operation if the voltage domains use different voltages. The voltage can be for example 10 V or more, 50 V or more or 100 V or more, e.g. approximately 180 V.

Owing to the relatively small distance d between the first electrode 14 and the second electrode 15, even relatively small damage caused by scratches is sufficient to enable a current flow between the first electrode 14 and the second electrode 15. Without scratches, by contrast, the first electrode 14 is electrically insulated from the second electrode 15, such that no current flow takes place. In this way, scratches can be detected on the basis of a current flow when a voltage is applied.

Such scratch detection can be effected in the context of a production test, for example at the end of production. Before the device in FIG. 1 is actually used, then the second electrode 15 (and if not that one, the first electrode 14 too) can be connected to ground potential, for example by a respective test pad being connected to ground, for example by way of a bond wire. In this way, the electrodes do not disturb operation of the circuit, at least not significantly.

Figure 2:
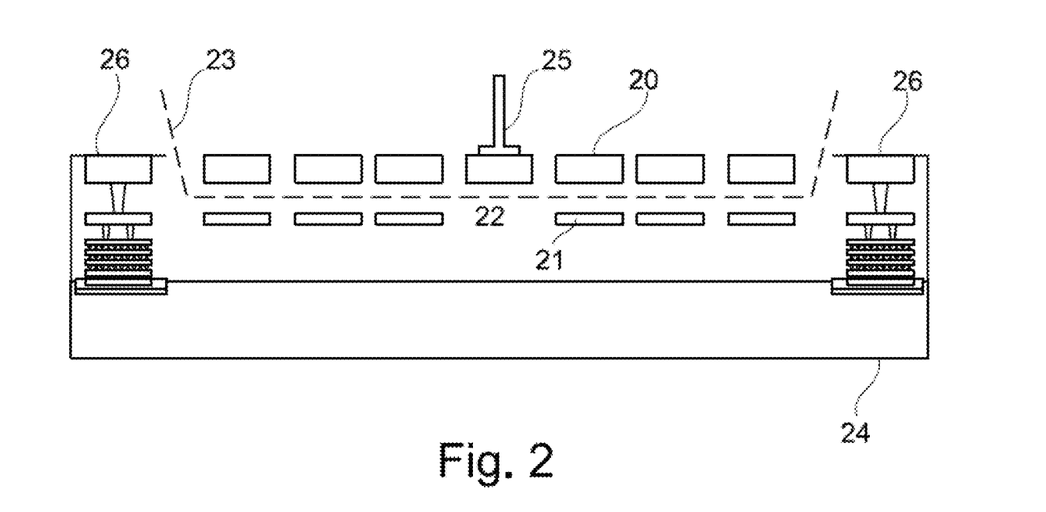
FIG. 2 is a cross-sectional view for illustrating one possible application environment for exemplary embodiments.

FIG. 2 shows a circuit comprising a coreless transformer and an isolation barrier between voltage domains as an example of an application environment of a scratch detection circuit such as the scratch detection circuit 13.

In this case, FIG. 2 shows a simplified cross-sectional view of such a coreless transformer. In FIG. 2, a first coil 21 is arranged in a first metal layer above a substrate 24, for example a semiconductor substrate, and a second coil 20 is arranged in a second metal layer above the substrate 24. A dielectric 22 is arranged between the coils 20, 21. The substrate 24 can be a semiconductor substrate, on which further circuit parts (not illustrated) can also be embodied, for example circuit parts of the second voltage domain 11 from FIG. 1, such as the control circuit discussed above. The second coil 20 is one example of the first voltage domain 10 from FIG. 1 and can be connected by way of a bond wire 25 to further circuits, for example integrated circuits, which belong to the first voltage domain. One example thereof is the abovementioned power transistors of a multiphase inverter. Such applications serve merely as an example here.

The first coil 21 can be connected to such a circuit embodied on the substrate 24 by metal connections (not illustrated), for example in the first metal layer of the first coil 21 or in further metal layers. A coreless transformer of this kind such as is shown in FIG. 2 can also be configured for differential signal transmission. In this case, a further pair of coils corresponding to the coils 20, 21 can be provided. Even further pairs of coils for parallel transmission of a plurality of signals can also be provided.

A guard ring 26 is embodied around the coils 20, 21, said guard ring being connected to a ground potential and having parts in the first metal layer of the first coil 21 and the second metal layer of the second coil 20 and also further parts in further metal layers, connected by vertical connections (VIAs, an abbreviation of "vertical interconnect access"). In this case, the parts of the guard ring in the different metal layers do not have to be arranged perpendicularly one above another as illustrated; an oblique arrangement in the shape of a staircase, for example, is also possible. In some embodiments said guard ring can serve as first electrode 14 of the scratch detection circuit 13. The parts of the guard ring which lie in the first and second metal layers can then be regarded as corresponding partial electrodes. The second electrode 15 can then likewise have partial electrodes at least in the first and second metal layers. In other exemplary embodiments, (partial) electrodes can also be provided for example only in the first metal layer or only in the second metal layer. The guard ring 26 forms a lateral isolation for the transformer formed by the coils 20, 21. Such an arrangement with the transformer formed by the coils 20, 21 and the guard ring 26 results in an isolation barrier between the voltage domains, as is depicted in a dashed manner as isolation barrier 23 in FIG. 2.

As already mentioned above, said isolation barrier can be damaged by scratches that can arise for example during chemical mechanical polishing in the course of the production of the coils 20, 21 made from copper. This will now be explained in greater detail with reference to FIGS. 3A and 3B.

Figure 3A:
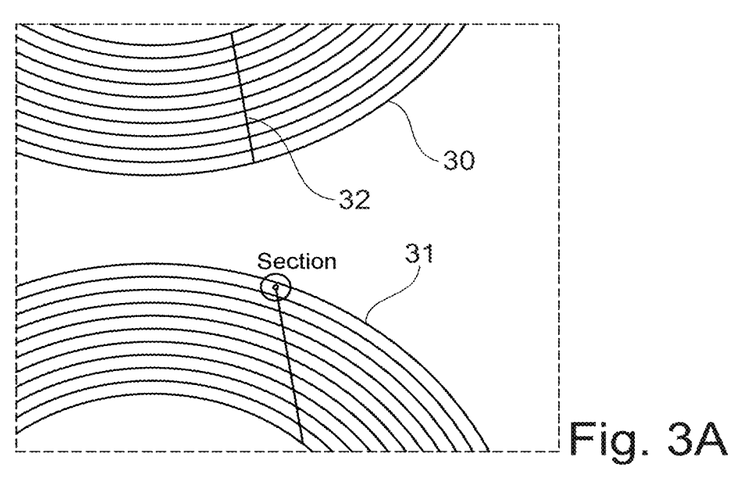
FIG. 3A is a plan view of a device with a scratch.
Figure 3B:
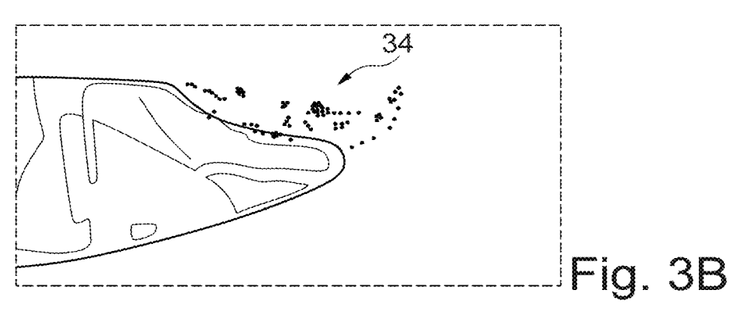
FIG. 3B is a cross-sectional view of a region from FIG. 3A for illustrating problems that can occur as a result of scratches.

FIG. 3A shows a plan view of a part of a device comprising two coils 30, 31 arranged in a metal layer, for example coils 20 of two coreless transformers as illustrated in FIG. 2. FIG. 3B shows a cross-sectional view of a region from FIG. 3A marked as "section".

FIG. 3A illustrates a scratch 32 passing through both coils 30, 31 and also the space between the coils. Scratches of this type such as the scratch 32 are caused by particles in a slurry used for a CMP process. Such particles can be diamond fragments or oxide fragments, for example. Said particles press into rounded corners of copper conductive tracks, of the coil 31 in the case of FIG. 3B, and can become lodged in a surrounding dielectric such as silicon dioxide, for example, as shown for a region 34 in FIG. 3B. In this regard, the dielectric is damaged or locally destroyed. These instances of damage or local destruction of the dielectric can then constitute a starting point for a high-voltage breakdown between the voltage domains.

Similar effects caused by scratches also occur at the first electrode 14 and the second electrode 15 of the scratch detection circuit 13 in FIG. 1 and between corresponding electrodes of scratch detection circuits discussed below. On account of the small distance d between the electrodes, here even a relatively low voltage between the electrodes, in the case of damage to the dielectric between the electrodes, then results in a current flow that can be measured. Scratches can thus be detected.

Figure 4:
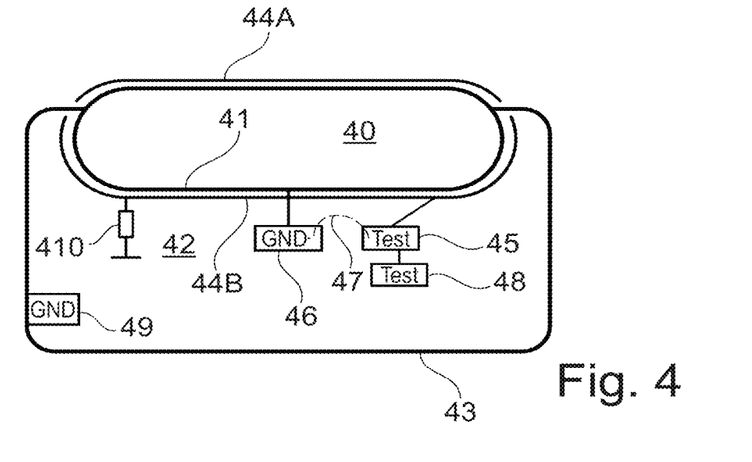
FIG. 4 is a plan view of a device in accordance with one exemplary embodiment.

FIG. 4 shows a plan view of a device in accordance with a further exemplary embodiment. The device in FIG. 4 comprises a region 40 with a first voltage domain, for example a domain of high voltage, lying therein. In addition, at least one part of a low-voltage domain can lie in the region 40. By way of example, in the region 40 there can be a transformer or a capacitor, one side (for example the second coil 20 from FIG. 2) of which belongs to a first voltage domain and the second side (for example the first coil 21 from FIG. 2) of which belongs to a second voltage domain, for example a domain of low voltage. The region 40 is surrounded by a guard ring 41, which can be constructed like the guard ring 26 from FIG. 2, for example. In the example illustrated, the guard ring 41 is electrically coupled to a further guard ring 43 surrounding a region 42 belonging to the second voltage domain (for example domain of low voltage). The guard ring 41 is connected to ground (GND) 49 by way of the guard ring 43. Alternatively or additionally, the guard ring can also be connected to a dedicated ground pad 46.

The guard ring 41, besides its function as a guard ring, serves as a first electrode of a scratch detection circuit.

In the example in FIG. 4, a second electrode comprises a first portion 44A and a second portion 44B and is referred to in summary as second electrode 44. In the example in FIG. 4, the first part 44A extends around an upper part of the guard ring 41 in FIG. 4, and the portion 44B extends around a lower part of the guard ring 41. The portions 44A, 44B each run parallel to the guard ring 41 and are at a distance therefrom which, as already explained for the scratch detection circuit 13 in FIG. 1, can be less than 2 µm, for example less than 1 µm, for example less than 600 nm, and can correspond to a minimum possible distance in some exemplary embodiments. The portions 44A, 44B are separated from one another by gaps, i.e. interruptions, in the case of FIG. 4 at locations where the guard ring 43 branches off from the guard ring 41. However, the portions 44A and 44B are electrically connected to one another, for example by lines in other metal layers and vertical connections, or by other additional lines. While two gaps are shown, the portions 44A, 44B can also have more gaps. By way of example, the portions 44A, 44B can extend over at least 80% of the length of the guard ring 41 in some exemplary embodiments, and can also pass over a smaller part of the guard ring 41 in other exemplary embodiments. Moreover, one of the portions 44A, 44B can be omitted in some exemplary embodiments. Moreover, the configuration can be different in different metal layers, such that, for example, both portions 44A, 44B are present in one metal layer, while only one of the portions is present in another metal layer.

By way of example, such gaps can occur at regular or irregular intervals, such that the gaps have for example 25%, 40% or even 75% of the length of the entire second electrode. Moreover, different shapes than the course shown in FIG. 4 are possible, as will be explained later with reference to FIGS. 6A to 6F. Such gaps or different shapes can facilitate the fabrication of the electrodes by means of lithography methods, since a problem of long resist webs can thus be avoided in some fabrication methods.

The second electrode is electrically coupled to a test pad 45. For the purpose of testing, a voltage is then applied to the test pad 45, for example by means of a needle using a tester device. Said voltage can be greater than 10 V, for example in the range of 50 V, 100 V or higher, e.g. approximately 180 V. A current flow in response to the voltage is then measured. If the dielectric between the guard ring 41, serving as first electrode, and the second electrode 44 is intact, no appreciable current flows. In the case of damage caused by scratches, by contrast, a current flow occurs which can be measured. Scratches can thus be detected. After the test, for example before the device is delivered to a customer, the test pad 45 can then be connected to the ground pad 46, to ground 49 or some other ground terminal by means of a bond wire 47, for example. Consequently, both the guard ring 41 and the second electrode 44 are then at ground when the device is actually in use. The second electrode 44A, 44B can then also serve as it were as an additional guard ring. As an alternative to the connection to ground that is effected after testing, it is also possible from the outset for the second electrode 44 to be connected to ground by way of a resistor 410 of high resistance, for example greater than 1000Ω (ohms), e.g. in the megohm range, for example greater than 1 MΩ or greater than 10 MΩ.

Optionally, a further test pad 48 can be provided, which is electrically conductively connected to the test pad 45. In this case, a tester device can firstly place a needle onto the test pad 45 and place a further needle onto the test pad 48, apply a voltage between the needles and measure a current flow between the needles. If current flows, this indicates that the needles are correctly contacting the test pads, in particular the test pad 45. The test described above can then be carried out.

Alternatively, if the resistor 410 is present, it is possible to check whether at least the expected leakage current from the test pad 45 is present across the resistor 410 in the test described above. If this not the case, this indicates that the test pad 45 is not correctly contacted.

It should be noted that, in other exemplary embodiments, the first electrode and the second electrode can also be provided independently of a guard ring. By way of example, the first electrode and the second electrode can be arranged in a manner extending around coils such as the coils 20, 21 from FIG. 2.

Copper lines in metal planes often have a rounded shape, as is also shown in FIG. 3B. In some exemplary embodiments, the first electrode (for example a guard ring) and the second electrode of a scratch detection circuit can have a first portion having a round cross section and a second portion having an end face in cross section. One example thereof is illustrated in FIG. 5.

Figure 5:
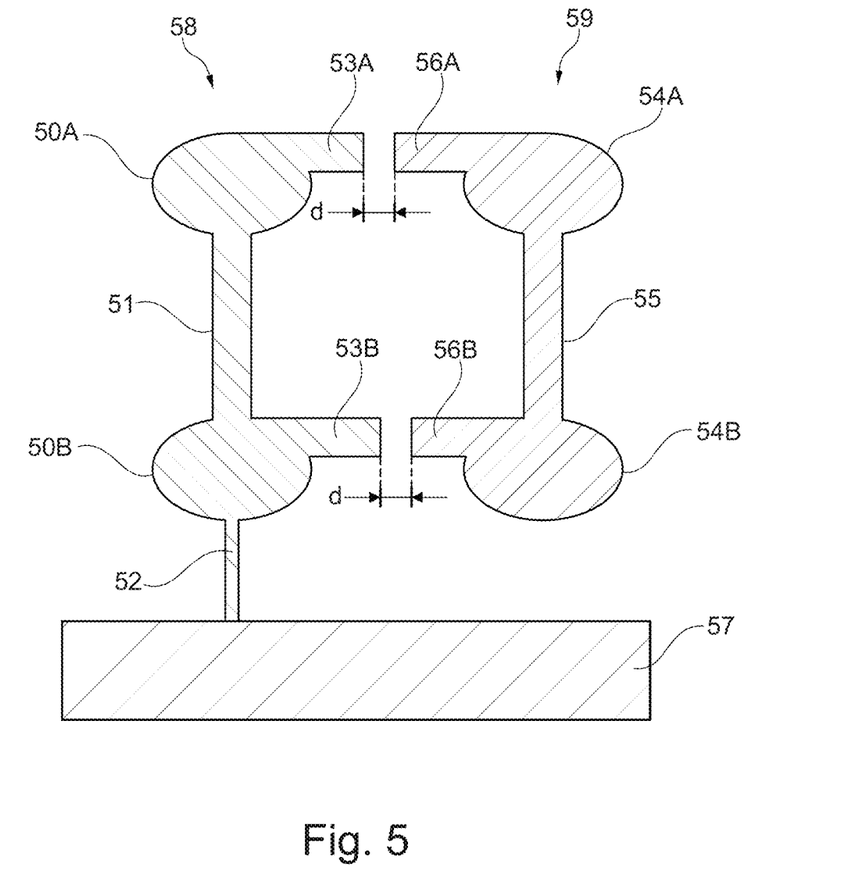
FIG. 5 is a cross-sectional view of a scratch detection circuit in some exemplary embodiments.

FIG. 5 shows a cross-sectional view of a scratch detection circuit comprising a first electrode 58 and a second electrode 59. The first electrode 58 can correspond to the guard ring 41 from FIG. 4, for example, and the second electrode 59 can correspond to the second electrode 44 from FIG. 4.

The first electrode 58 has a first partial electrode 50A and a second partial electrode 50B. The first partial electrode 50A can be arranged in a first metal layer above a substrate 57, and the second partial electrode 50B can be arranged in a second metal layer above the substrate 57. The first and second metal layers can correspond to the metal layers of the coils 20, 21 from FIG. 2 or to corresponding metal layers of capacitor plates. In other exemplary embodiments, it is also possible for only one partial electrode to be provided, or it is possible for more than two partial electrodes to be provided.

The first partial electrode 50A and the second partial electrode 50B are electrically connected to one another via a connection 51, for example a vertical connection (VIA, an abbreviation of "vertical interconnect access"). Moreover, the second partial electrode 50B is connected via a further vertical connection to the substrate 57 and there to ground. Some other type of connection to ground, for example an electrically conductive connection to ground 49 or the ground pad 46 from FIG. 4, can likewise be provided. The second electrode 59 has a first partial electrode 54A and a second partial electrode 54B, which are connected to one another by a vertical connection 55. The first partial electrode 54A of the second electrode 59 is assigned to the first partial electrode 50A of the first electrode 58 and is arranged in the same metal layer as the latter, and the second partial electrode 54B of the second electrode 59 is assigned to the second partial electrode 50B of the first electrode 58 and is arranged in the same metal layer as the latter.

In this case, the partial electrodes 50A, 50B and respectively 54A, 54B do not have to be arranged perpendicularly one above another, but rather can e.g. also be arranged in an obliquely extending manner.

In this case, the partial electrodes 50A, 50B, 54A, 54B each have a first portion having a round cross section (elliptical cross section in the example in FIG. 5) and a second portion 53A, 53B, 56A and 56B, respectively, wherein the second portions in the example illustrated are rectangular and each have an end face. The end faces of the second portions 53A, 56A face one another, and the end faces of the second portions 53B, 56B face one another. A distance d between the end faces defines the distance between the first electrode 58 and the second electrode 59 and can be dimensioned in a manner corresponding to the distance d in FIG. 1, that is to say for example less than 2 μm, less than 1 μm, less than 600 nm, or in a manner corresponding to a minimum distance used for a technology used for producing the device.

By means of the second portions 53A, 53B, 56A, 56B having the end faces, a defined distance between the electrodes is produced, despite an otherwise round shape in the first portions. Moreover, in the case of the illustrated shape and the copper depth associated therewith, particles can readily penetrate during a CMP process and thus cause damage as described above.

In the exemplary embodiment in FIG. 4, in a plan view of the device in FIG. 3, the guard ring 41 as first electrode and the second electrode 44 extend substantially parallel and straight, apart from some bent portions. Other courses of the first electrode and second electrode are also possible. Various examples of courses of the electrodes in scratch detection circuits will now be explained with reference to FIGS. 6A to 6F. In this case, FIGS. 6A to 6F each show a plan view of a first electrode and a second electrode. These shapes, as a modification of the electrodes, can be applied to each of the exemplary embodiments discussed above. Moreover, mixed forms are possible, that is to say that, for example, one portion of the electrodes can be embodied as shown in FIG. 6B and another portion of the electrodes can be embodied as shown in FIG. 6C, and/or different shapes can be used in different metal layers, for example in the case of the different partial electrodes in FIG. 5. In exemplary embodiments in FIGS. 6B to 6F in which the shapes of the first and second electrodes differ, these shapes can also be interchanged, that is to say that the first electrode can have the shape of the second electrode, and vice versa.

Figure 6A:
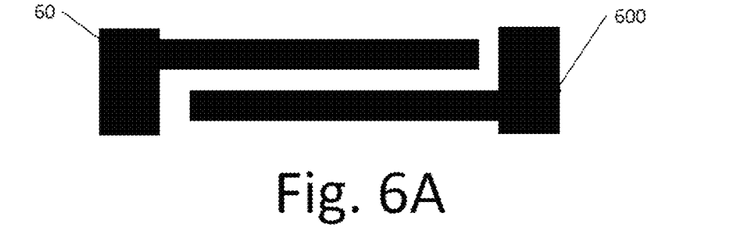
FIGS. 6A to 6F show various configurations of electrodes of scratch detection circuits in various exemplary embodiments.
Figure 6B:
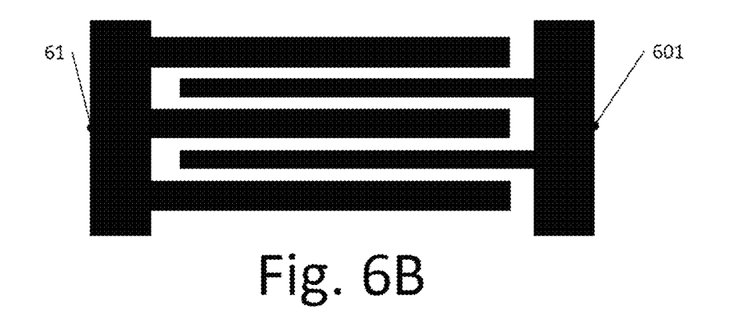
Figure 6C:
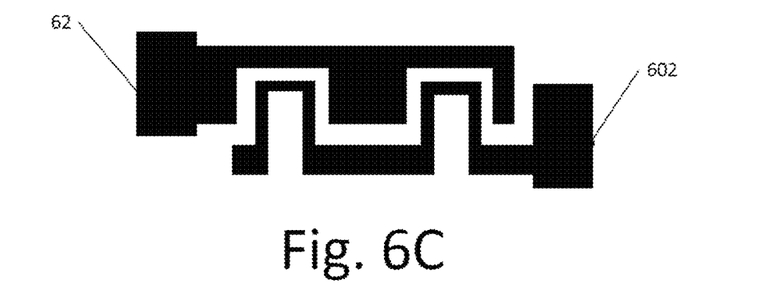

In FIG. 6A, a first electrode 60 has a portion extending toward a second electrode 600, said portion also being referred to as a finger, and a second electrode 600 correspondingly has a finger extending toward the first electrode 60. Such pairs of fingers can also be provided at a plurality of locations. FIG. 6B shows an extension in which in each case a plurality of fingers are embodied at a first electrode 61 and a second electrode 6oi, said fingers intermeshing. A structure of this type is also referred to as an interdigital structure.

In FIG. 6C, a first electrode 62 has angular cutouts, and a second electrode 602 has an angled course that engages in the cutouts of the first electrode 62.

Figure 6D:
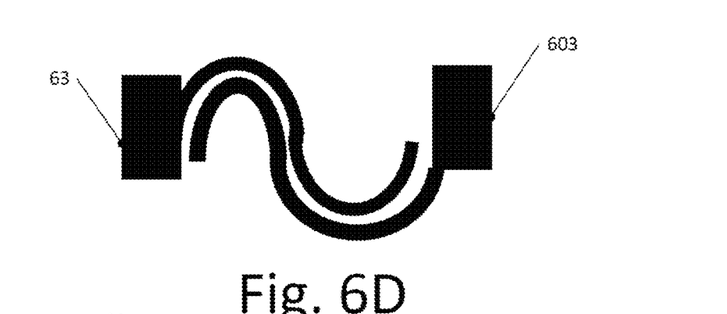

In FIG. 6D, a first electrode 63 has a wavy shape, and a second electrode 603 has a wavy shape extending parallel thereto.

Figure 6E:
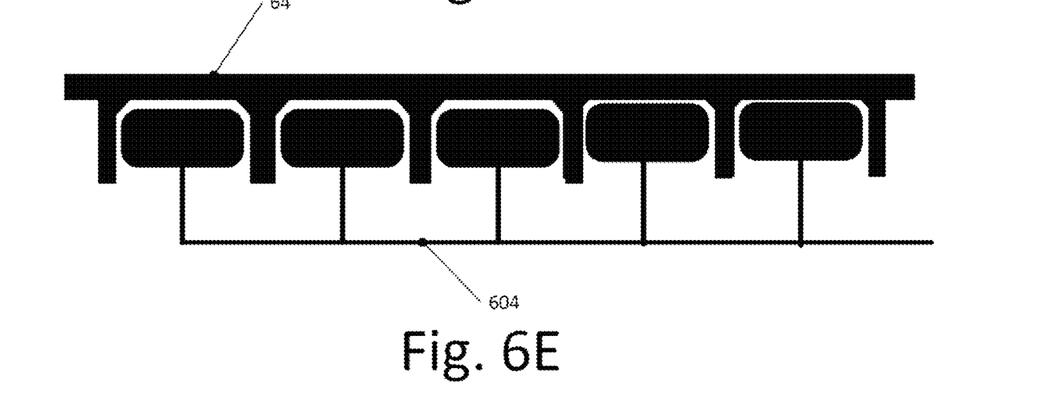

In FIG. 6E, a first electrode 64 has a multiplicity of fingers defining cutouts, and a second electrode 604 has padlike structures arranged between said fingers.

Figure 6F:
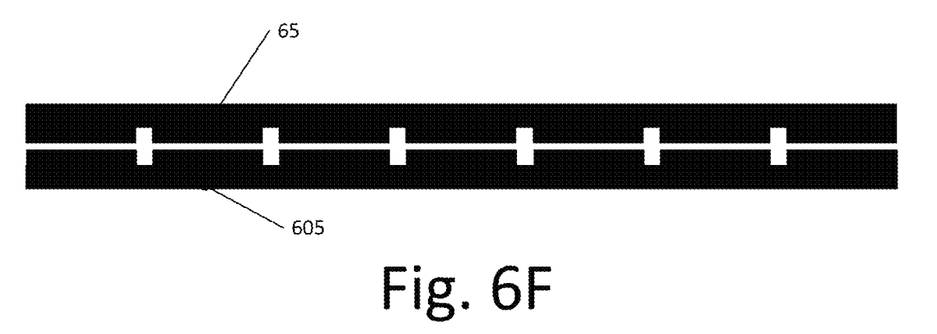

In FIG. 6F, a first electrode 65 and a second electrode 605 extend in a straight line parallel to one another, wherein protuberances facing one another are provided at regular or irregular intervals. While these protuberances have an angular shape in FIG. 6F, round protuberances can also be used in other exemplary embodiments.

The shapes FIGS. 6A to 6F can contribute to enlarging a region between the electrodes in which the electrodes are at a small distance from one another, and/or can simplify production by virtue of avoiding, in the case of production by means of lithography, for example, long straight resist webs for forming the insulating region between the electrodes.

As evident from FIGS. 6A to 6F, a multiplicity of different shapes of electrodes are thus possible, and exemplary embodiments are not restricted to a specific shape.

It should be noted that the structures shown in FIGS. 6A to 6F can also be lengthened, for example, in order to form an electrode pair comprising a guard ring and a second electrode as shown in FIG. 4 substantially over an entire length of the guard ring.

Figure 7:
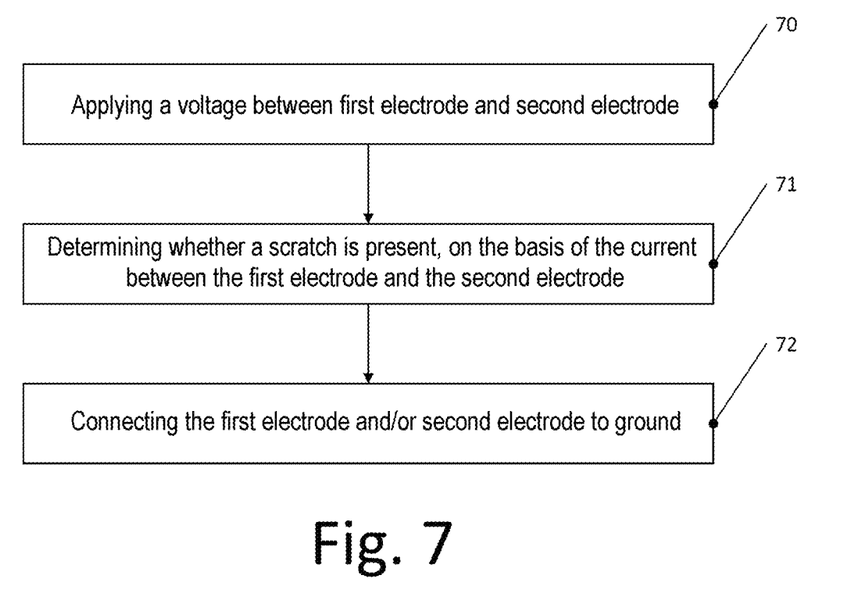
FIG. 7 is a flow diagram for illustrating methods in accordance with some exemplary embodiments.

FIG. 7 shows a flow diagram for illustrating methods in accordance with some exemplary embodiments. The method in FIG. 7 describes the use of scratch detection circuits comprising two electrodes as described above and is explained with reference thereto.

In step 70, the method comprises applying a voltage between a first electrode and a second electrode of a scratch detection circuit, for example the first and second electrodes described above.

In step 71, the method comprises determining whether a scratch is present, on the basis of a current between the first electrode and the second electrode. In this case, it is possible in particular to determine that a scratch is present if a current flows, and to determine that no scratch is present if no current flows. If a scratch is present, a corresponding device can be discarded as a reject. If it is determined that no scratch is present, the first electrode and/or the second electrode can be connected to ground for later operation of the device, as has been explained on the basis of the bond wire 47 with reference to FIG. 4.

While scratch detection circuits have been described above in the context of devices comprising a first voltage domain and a second voltage domain, such scratch detection circuits can also be used independently thereof if scratches can occur in particular during the production of devices, as in the case of semiconductor components, for example, in which a process for forming metal connections comprises chemical mechanical polishing, in particular when copper is used as metal. In this case, for example, a plurality of scratch detection circuits can be arranged in a manner distributed over a chip in order to be able to detect scratches at various locations of the chip. In the case of the two voltage domains as well, as explained above, it is possible to distribute a plurality of scratch detection circuits over the chip.

Some exemplary embodiments are defined by the following examples:

Example 1. A device, comprising:
a first voltage domain and a second electrode, wherein a distance between the first electrode and the second electrode is less than 2 μm.

Example 2. The device according to example 1, wherein the distance is less than 1 μm or less than 600 nm.

Example 3. The device according to example 1 or 2, wherein the second voltage is less than the first voltage.

Example 4. The device according to example 3, wherein the second voltage is at least 20 V less than the first voltage.

Example 5. The device according to any of examples 1 to 4, wherein the device comprises a guard ring surrounding at least one part of the first voltage domain, wherein the guard ring serves as first electrode.

Example 6. The device according to example 3, wherein the second electrode extends parallel to the guard ring.

Example 7. The device according to example 5 or 6, wherein the second electrode is provided over at least 80% of the length of the guard ring.

Example 8. The device according to either of examples 5 and 6, wherein the second electrode is provided over less than 60% of the length of the guard ring.

Example 9. The device according to any of examples 1 to 8, wherein the first electrode and/or the second electrode have/has one or more interruptions.

Example 10. The device according to example 9, wherein a total length of the interruptions is less than 75% of the total length of the first electrode and/or of the second electrode (i.e. of that/those electrode(s) having the interruptions).

Example 11. The device according to any of examples 1 to 10, wherein the first electrode has a number of first partial electrodes, wherein the first number is greater than or equal to 1, wherein the second electrode has the number of second partial electrodes, wherein a first partial electrode and a second partial electrode assigned to one another in each case are arranged in the same metal layer.

Example 12. The device according to example 11, wherein each first partial electrode and each second partial electrode have a first portion having a round cross section and a second portion having a cross section having an end face, wherein the end faces of the first and second partial electrodes assigned to one another face one another.

Example 13. The device according to example 11 or 12, wherein the first voltage domain and the second voltage domain are coupled by way of a coreless transformer, wherein the first and second partial electrodes are arranged in the same metal layers as coils of the coreless transformer.

Example 14. The device according to example 11 or 12, wherein the first voltage domain and the second voltage domain are coupled by way of one or more capacitors, wherein the first and second partial electrodes are arranged in the same metal layers as electrodes or capacitors.

Example 15. The device according to any of examples 1 to 14, wherein at least one portion of first electrode and at least one portion of the second electrode in each case have one or more fingers, wherein the fingers of the first electrode extend parallel to the fingers of the second electrode.

Example 16. The device according to example 15, wherein the fingers of the first electrode and of the second electrode form an interdigital structure.

Example 17. The device according to any of examples 1 to 16, wherein at least one portion of one of the first electrode or the second electrode has cutouts, and wherein at least one portion of the other of the first electrode and the second electrode has parts lying in the cutouts.

Example 18. The device according to any of examples 1 to 17, wherein at least one portion of the first electrode and of the second electrode has a wavy shape, wherein the wavy shapes of the electrode and of the second electrode extend parallel to one another.

Example 19. The device according to any of examples 1 to 18, wherein in at least one portion the first electrode extends parallel to the second electrode and the first electrode and the second electrode have cutouts facing one another.

Example 20. The device according to any of examples 1 to 19, wherein the first electrode is connected to ground.

Example 21. The device according to any of examples 1 to 20, wherein the first electrode and/or the second electrode are/is configured to be connected to ground in a normal operating mode of the device and to be connected to a test terminal in a test operating mode.

Example 22. The device according to any of examples 1 to 21, wherein the first electrode and/or the second electrode are/is connected to ground by way of a resistor having a resistance value of 1000 ohms or more.

Example 23. The device according to any of examples 1 to 22, wherein the first electrode is connected to ground, wherein the second electrode is connected to a test pad, and wherein the test pad is connected to ground by way of a bond wire.

Example 24. A method for testing the device according to any of examples 1 to 23, comprising:
applying a voltage between the first electrode and the second electrode in reaction to the voltage.

Example 25. The method according to example 24, wherein the voltage is greater than 10 V.

Example 26. The method according to example 24 or 25, further comprising connecting the first electrode and/or the second electrode to ground after the determining.

Example 27. The method according to any of examples 24 to 26, further comprising treating the device as a reject if it is determined that a scratch is present.

Example 28. A scratch detection circuit, comprising:
a first electrode and a second electrode, wherein a distance between the first electrode and the second electrode is less than 2 μm.

Example 29. The scratch detection circuit according to example 28, wherein the distance is less than 1 μm or less than 600 nm.

Example 30. The scratch detection circuit according to example 28 or 29, wherein the first electrode is a guard ring.

Example 31. The scratch detection circuit according to example 30, wherein the second electrode extends parallel to the guard ring.

Example 32. The scratch detection circuit according to example 30 or 31, wherein the second electrode is provided over at least 80% of the length of the guard ring.

Example 33. The scratch detection circuit according to either of examples 30 and 31, wherein the second electrode is provided over less than 60% of the length of the guard ring.

Example 34. The scratch detection circuit according to any of examples 28 to 33, wherein the first electrode and/or the second electrode have/has one or more interruptions.

Example 35. The scratch detection circuit according to example 34, wherein a total length of the interruptions is less than 75% of the total length of the first electrode or second electrode.

Example 36. The scratch detection circuit according to any of examples 28 to 35, wherein the first electrode has a number of first partial electrodes, wherein the first number is greater than or equal to 1, wherein the second electrode has the number of second partial electrodes, wherein a first partial electrode and a second partial electrode assigned to one another in each case are arranged in the same metal layer.

Example 37. The scratch detection circuit according to example 36, wherein each first partial electrode and each second partial electrode has a first portion having a round cross section and a second portion having a cross section having an end face, wherein the end faces of the first and second partial electrodes assigned to one another face one another.

Example 38. The scratch detection circuit according to any of examples 28 to 37, wherein at least one portion of the first electrode and at least one portion of the second electrode in each case have one or more fingers, wherein the fingers of the first electrode extend parallel to the fingers of the second electrode.

Example 39. The scratch detection circuit according to example 38, wherein the fingers of the first electrode and of the second electrode form an interdigital structure.

Example 40. The scratch detection circuit according to any of examples 28 to 39, wherein at least one portion of one of the first electrode or the second electrode has cutouts, and wherein at least one portion of the other of the first electrode and the second electrode has parts lying in the cutouts.

Example 41. The scratch detection circuit according to any of examples 28 to 40, wherein at least one portion of the first electrode and of the second electrode has a wavy shape, wherein the wavy shapes of the electrode and of the second electrode extend parallel to one another.

Example 42. The scratch detection circuit according to any of examples 28 to 41, wherein in at least one portion the first electrode extends parallel to the second electrode and the first electrode and the second electrode have cutouts facing one another.

Example 43. The scratch detection circuit according to any of examples 28 to 42, wherein the first electrode is connected to ground.

Example 44. The scratch detection circuit according to any of examples 28 to 43, wherein the first electrode and/or the second electrode are/is connected to ground by way of a resistor having a resistance value of 1000 ohms or more.

Example 45. The scratch detection circuit according to any of examples 28 to 44, wherein the first electrode is connected to ground, wherein the second electrode is connected to a test pad, and wherein the test pad is connected to ground by way of a bond wire.

Example 46. The device according to any of examples 1 to 23 or the scratch detection circuit according to any of examples 28 to 44, wherein the first electrode and/or the second electrode are/is connected to a respective first test pad, wherein the first test pad is electrically connected to a respective second test pad.

Although specific exemplary embodiments have been illustrated and described in this description, persons with customary expert knowledge will recognize that a multiplicity of alternative and/or equivalent implementations can be chosen as substitution for the specific exemplary embodiments shown and described in this description, without departing from the scope of the invention shown. The intention is for this application to cover all adaptations or variations of the specific exemplary embodiments discussed here. Therefore, the intention is for this invention to be restricted only by the claims and the equivalents of the claims.

What is claimed is:

1. A device, comprising:
   a first voltage domain designed to be operated at a first voltage;
   a second voltage domain designed to be operated at a second voltage;
   an isolation barrier separating the first and second voltage domains; and
   a scratch detection circuit comprising a first electrode and a second electrode, wherein a distance between the first electrode and the second electrode is less than 2 μm,
   wherein the first electrode has a number of first partial electrodes, wherein a first number is greater than or equal to one, wherein the second electrode has a number of second partial electrodes, and wherein a first partial electrode and a second partial electrode are arranged in a same metal layer, and
   wherein the first voltage domain and the second voltage domain are coupled by way of a coreless transformer, and wherein the first and second partial electrodes are arranged in a respective same metal layer as coils of the coreless transformer.

2. The device as claimed in claim 1, wherein the device comprises a guard ring surrounding at least one part of the first voltage domain, wherein the guard ring serves as a first electrode.

3. The device as claimed in claim 2, wherein the second electrode extends parallel to the guard ring.

4. The device as claimed in claim 2, wherein the second electrode is provided along at least 80% of a length of the guard ring.

5. The device as claimed in claim 1, wherein the first electrode and/or the second electrode have/has one or more interruptions.

6. The device as claimed in claim 5, wherein a total length of the interruptions is less than 75% of a total length of the first electrode and/or second electrode.

7. The device as claimed in claim 1, wherein each first partial electrode and each second partial electrode have a first portion having a round cross section and a second portion having a cross section having an end face, wherein the end faces of the first and second partial electrodes face one another.

8. The device as claimed in claim 1, wherein the first voltage domain and the second voltage domain are coupled by way of one or more capacitors, wherein the first and second partial electrodes are arranged in a respective same metal layer as electrodes of the one or more capacitors.

9. The device as claimed in claim 1, wherein at least one portion of the first electrode and at least one portion of the second electrode in each case have one or more fingers, wherein the fingers of the first electrode extend parallel to the fingers of the second electrode.

10. The device as claimed in claim 1, wherein at least one portion of one of the first electrode or the second electrode has cutouts, and wherein at least one portion of the other of the first electrode and the second electrode has parts lying in the cutouts.

11. The device as claimed in claim 1, wherein at least one portion of the first electrode and of the second electrode has a wavy shape, wherein the wavy shapes of the first electrode and of the second electrode extend parallel to one another.

12. The device as claimed in claim 1, wherein in at least one portion of the first electrode extends parallel to the second electrode and the first electrode and the second electrode have cutouts facing one another.

13. The device as claimed in claim 1, wherein the first electrode is connected to ground.

14. The device as claimed in claim 1, wherein the first electrode and/or the second electrode are/is configured to be connected to ground in a normal operating mode of the device and to be connected to a test terminal in a test operating mode.

15. The device as claimed in claim 1, wherein the first electrode and/or the second electrode are/is connected to ground by way of a resistor having a resistance value of 1000 ohms or more.

16. The device as claimed in claim 1, wherein the first electrode is connected to ground, wherein the second electrode is connected to a test pad, and wherein the test pad is connected to ground by way of a bond wire.

17. A method for testing the device as claimed in claim 1, comprising:
   applying a voltage between the first electrode and the second electrode,
   determining whether a scratch is present on the basis of a current between the first electrode and the second electrode in reaction to the voltage, wherein the scratch passes through the coils and a space between the coils caused by particles of a chemical mechanical polishing process, wherein the particles are pressed into rounded corners of the coils and become lodged in a surrounding dielectric, and wherein the dielectric is damaged or locally destroyed to allow the current to flow.

18. The method as claimed in claim 17, further comprising connecting the first electrode and/or the second electrode to ground after the determining.

* * * * *